(12) United States Patent  
Moriguchi et al.

(10) Patent No.: US 7,897,443 B2  
(45) Date of Patent: Mar. 1, 2011

(54) PRODUCTION METHOD OF SEMICONDUCTOR DEVICE AND SEMICONDUCTOR DEVICE

(75) Inventors: Masao Moriguchi, Tenri (JP); Yutaka Takafuji, Nara (JP); Steven Roy Droes, Camas, WA (US)

(73) Assignee: Sharp Kabushiki Kaisha, Osaka (JP)

( * ) Notice: Subject to any disclaimer, the term of this patent is extended or adjusted under 35 U.S.C. 154(b) by 749 days.

(21) Appl. No.: 11/883,483

(22) PCT Filed: Jan. 17, 2006

(86) PCT No.: PCT/JP2006/300537

§ 371 (c)(1),  
(2), (4) Date: Aug. 1, 2007

(87) PCT Pub. No.: WO2006/117900

PCT Pub. Date: Nov. 9, 2006

(65) Prior Publication Data

US 2008/0149928 A1    Jun. 26, 2008

(30) Foreign Application Priority Data

Apr. 26, 2005    (JP)    ............................. 2005-128135

(51) Int. Cl.  
*H01L 21/762*    (2006.01)

(52) U.S. Cl. ................. 438/162; 257/E21.568

(58) Field of Classification Search ........................ None  
See application file for complete search history.

(56) References Cited

U.S. PATENT DOCUMENTS

| | | | | |
|---|---|---|---|---|
| 5,627,085 | A | * | 5/1997 | Gosain et al. ............... 438/162 |
| 6,225,192 | B1 | * | 5/2001 | Aspar et al. ................. 438/460 |
| 6,335,231 | B1 |   | 1/2002 | Yamazaki et al. |
| 7,183,179 | B2 | * | 2/2007 | Droes et al. ................. 438/473 |
| 7,262,464 | B2 | * | 8/2007 | Takafuji et al. ............. 257/347 |
| 7,425,475 | B2 | * | 9/2008 | Fukushima et al. ......... 438/151 |

(Continued)

FOREIGN PATENT DOCUMENTS

JP    05-235038    9/1993

(Continued)

OTHER PUBLICATIONS

International Search Report for PCT/JP2006/300537 mailed Apr. 25, 2006 (English and Japanese).

(Continued)

*Primary Examiner*—Benjamin P Sandvik  
(74) *Attorney, Agent, or Firm*—Nixon & Vanderhye P.C.

(57) ABSTRACT

The present invention provides a production method of a semiconductor device, which can improve characteristics of a semiconductor element including a single crystal semiconductor layer formed by transferring on an insulating substrate. The present invention is a production method of a semiconductor device comprising a single crystal semiconductor layer formed on an insulating substrate, the production method comprising the steps of: implanting a substance for separation into a single crystal semiconductor substrate, thereby forming a separation layer; transferring a part of the single crystal semiconductor substrate, separated at the separation layer, onto the insulating substrate, thereby forming the single crystal semiconductor layer; forming a hydrogen-containing layer on at least one side of the single crystal semiconductor layer; and diffusing hydrogen from the hydrogen-containing layer to the single crystal semiconductor layer.

23 Claims, 10 Drawing Sheets

U.S. PATENT DOCUMENTS

| | | | |
|---|---|---|---|
| 7,436,027 B2 * | 10/2008 | Ogawa et al. | 257/347 |
| 7,563,693 B2 * | 7/2009 | Fukushima et al. | 438/458 |
| 2002/0137265 A1 | 9/2002 | Yamazaki et al. | |
| 2003/0183876 A1 * | 10/2003 | Takafuji et al. | 257/347 |
| 2004/0029338 A1 * | 2/2004 | Yamazaki et al. | 438/202 |
| 2004/0061176 A1 * | 4/2004 | Takafuji et al. | 257/347 |
| 2004/0099915 A1 * | 5/2004 | Takayama et al. | 257/411 |
| 2005/0009252 A1 | 1/2005 | Yamazaki et al. | |
| 2005/0026434 A1 * | 2/2005 | Huy et al. | 438/689 |

FOREIGN PATENT DOCUMENTS

| | | |
|---|---|---|
| JP | 06-077484 | 3/1994 |
| JP | 08-032077 | 2/1996 |
| JP | 2000-150905 | 5/2000 |
| JP | 2001-093853 | 4/2001 |
| JP | 2003-282885 | 10/2003 |
| JP | 2004-165600 | 6/2004 |
| JP | 2004-363627 | 12/2004 |
| JP | 2005-026472 | 1/2005 |

OTHER PUBLICATIONS

Bruel, "Silicon on insulator material technology," Electronics Letters, Institute of Electrical and Electronic Engineers, Jul. 6, 1995, vol. 31, No. 14, pp. 1201-1202.

Bruel et al., "Smart-Cut: A New Silicon on Insulator Material Technology Based on Hydrogen Implantation and Wafer Bonding," Japanese Journal of Applied Physics, the Japan Society of Applied Physics, Mar. 1997, vol. 36, pp. 1636-1641.

* cited by examiner

PRODUCTION METHOD OF SEMICONDUCTOR DEVICE AND SEMICONDUCTOR DEVICE

This application is the US national phase of international application PCT/JP2006/300537 filed 17 Jan. 2006, which designated the U.S. and claims priority to JP 2005-128135 filed 26 Apr. 2005, the entire content of each of which is hereby incorporated by reference.

TECHNICAL FIELD

The present invention relates to production methods of semiconductor devices, semiconductor devices, and liquid crystal display devices. More specifically, the present invention relates to: a production method of a semiconductor device, in which a fine circuit with high performances is formed on a substrate using a transferring technology; and a semiconductor device and a liquid crystal display device each obtained by such a production method.

BACKGROUND ART

With respect to the production method of the semiconductor device, a Smart-cut method in which hydrogen is implanted into a semiconductor substrate and the substrate is attached to another substrate and then separated along a hydrogen-implanted layer by annealing, thereby completing the transferring on another substrate has been proposed (for example, refer to Nonpatent Documents 1 and 2). Further, a method in which a part of a single crystal silicon layer-including semiconductor element is transferred onto an insulating substrate by separation at a separation layer formed by implanting hydrogen into a single crystal silicon substrate in which a part of the semiconductor element such as a MOS (Metal Oxide Semiconductor) transistor is formed (for example, refer to Patent Documents 1 to 3). Use of these technologies makes it possible to form an SOI (Silicon On Insulator) substrate including a single crystal silicon layer formed on an insulating substrate. A semiconductor element such as a transistor is formed on such an SOI substrate, and thereby a parasitic capacity can be reduced and an insulation resistance can be improved. Therefore, a highly integrated semiconductor device with high performances can be provided.

For sufficient separation at the separation layer formed as a part of the single crystal silicon substrate, very highly-concentrated hydrogen of $4 \times 10^{16}$ atoms/cm$^3$ or more needs to be implanted into the single crystal silicon substrate, for example. Therefore, about $1 \times 10^{21}$ atoms/cm$^3$ of hydrogen generally exists in the single crystal silicon layer formed on the insulating substrate by the transferring. In addition, the crystal orientation is maintained even after the hydrogen implantation, but a lot of fine crystal defects are generated by crystal lattice distortion. The fine crystal defects used herein include a point defect, a transfer defect, a stacking defect, and the like, and mean those observed as a small pit through etching.

For this problem, annealing at a high temperature of 1000° C. or more is performed when the SOI substrate is formed, and thereby removal of residual hydrogen and recovery of the crystal defects can be sufficiently performed. However, if the single crystal silicon layer is formed on a glass substrate, the temperature and the time for the annealing are limited because the glass substrate has a low heat resistance. Therefore, the annealing is insufficiently performed and about $1 \times 10^{20}$ atoms/cm$^3$ of hydrogen and fine crystal defects exist in the semiconductor layer even after the annealing.

It is known that this residual hydrogen is chemically active and therefore, in the single crystal silicon layer, such hydrogen (1) becomes a donor, (2) deactivates impurity ions such as boron, (3) becomes an acceptor, for example, to largely change electrical characteristics of the semiconductor element. It is also known that the fine crystal defects become an electron or hole trap and traps at a density of $1 \times 10^{17}$ atoms/cm$^3$ or more are formed, and therefore such defects largely reduce electrical characteristics of the semiconductor element.

Therefore, in a commonly used method for producing a semiconductor device by a technology of transferring a single crystal film, within a temperature range where a glass substrate can be used, a single crystal film with an uniform orientation can be obtained on the substrate, but the residual hydrogen and the crystal defects, caused by the hydrogen implantation, make it difficult to produce a semiconductor device with sufficient device characteristics. Specifically, there is room for improvement in reduction in mobility, shift of a threshold voltage, increase in leak current at OFF state, increase in subthreshold coefficient (S value) and the like.

In addition, with respect to a polycrystalline silicon film formed on an insulating substrate by a laser crystallization method, a solid phase deposition method and the like, a method in which a hydrogen-containing layer is formed and hydrogen is diffused into a polycrystalline silicon film, thereby eliminating crystal defects in the polycrystalline silicon film has been known (for example, refer to Patent Documents 4 to 6). However, adverse effects such as change of characteristics and reduction in reliability, attributed to the hydrogen diffusion, are generated if the technology of diffusing hydrogen into a silicon film is applied to a common single crystal silicon film.

[Nonpatent Document 1]
"Electronics Letters", (U.S.), Institute of Electrical and Electronic Engineers, 1995, No. 14, Vol. 31, p. 1201

[Nonpatent Document 2]
"Japanese Journal of Applied Physics", the Japan Society of Applied Physics, 1997, Vol. 36, p. 1636

[Patent Document 1]
Japanese Kokai Publication No. 2003-282885

[Patent Document 2]
Japanese Kokai Publication No. 2004-165600

[Patent Document 3]
Japanese Kokai Publication No. 2005-26472

[Patent Document 4]
Japanese Kokai Publication No. Hei-05-235038

[Patent Document 5]
Japanese Kokai Publication No. Hei-08-32077

[Patent Document 6]
Japanese Kokai Publication No. 2001-93853

DISCLOSURE OF INVENTION

The present invention has been made in view of the above-mentioned state of the art. The present invention has an object to provide: a production method of a semiconductor device, which can improve characteristics of a semiconductor element including a single crystal semiconductor layer formed on an insulating substrate by transferring; and a semiconductor device and a liquid crystal display device each produced by such a production method.

The present inventors made various investigations on a production method of a semiconductor device, which can improve characteristics of a semiconductor element including a single crystal semiconductor layer formed on an insulating substrate by transferring. The inventors noted residual hydrogen and fine crystal defects generated by hydrogen implanted when a separation layer for transferring is formed in a single crystal semiconductor substrate. The inventors noted that the electrically active residual hydrogen is deactivated and dangling bonds in the fine crystal defects generated by lattice distortion caused by the hydrogen implantation can be terminated if in the production method of the semiconductor device, steps of: implanting a substance for separation into a single crystal semiconductor substrate, thereby forming a separation layer; transferring a part of the single crystal semiconductor substrate, separated at the separation layer, onto an insulating film, thereby forming a single crystal semiconductor layer; forming a hydrogen-containing layer on at least one side of the single crystal semiconductor layer; and diffusing hydrogen from the hydrogen-containing layer to the single crystal semiconductor layer, are performed. As a result, the above-mentioned problems have been admirably solved, leading to completion of the present invention.

That is, the present invention is a production method of a semiconductor device comprising a single crystal semiconductor layer formed on an insulating substrate, the production method comprising the steps of: implanting a substance for separation into a single crystal semiconductor substrate, thereby forming a separation layer (separation layer-forming step); transferring a part of the single crystal semiconductor substrate, separated at the separation layer, onto the insulating substrate, thereby forming the single crystal semiconductor layer (single crystal semiconductor layer-forming step); forming a hydrogen-containing layer on at least one side of the single crystal semiconductor layer (hydrogen-containing layer-forming step); and diffusing hydrogen from the hydrogen-containing layer to the single crystal semiconductor layer (hydrogen diffusion step).

In the semiconductor device obtained by the present invention, hydrogen diffused from the hydrogen-containing layer into the single crystal semiconductor layer deactivates the electrically active residual hydrogen, and terminates the dangling bonds in the fine crystal defects, thereby significantly reducing a defect density in the crystal. As a result, characteristics of the obtained device can be significantly improved. FIG. 4 shows actually obtained experimental results. With respect to a MOS having a single crystal silicon layer formed by transferring, FIG. 4 shows characteristics Ids (A) of a source-drain current according to a gate voltage Vg (V) in (1) an NMOS in which a silicon nitride film (SiNx) is formed as the hydrogen-containing layer, (2) an NMOS in which no silicon nitride film (SiNx) is formed as the hydrogen-containing layer, (3) a PMOS in which a silicon nitride film (SiNx) is formed as the hydrogen-containing layer, and (4) a PMOS in which no silicon nitride film (SiNx) is formed as the hydrogen-containing layer. As shown in FIG. 4, effects such as increase in mobility, reduction in S value, and reduction in off-state current can be clearly observed in both of the NMOS and the PMOS if the silicon nitride film was formed and the step of diffusing hydrogen was performed. Particularly in the Pch (channel)-type, the off-state current and the S value were significantly improved. This may be because the active residual hydrogen (donor) was deactivated by the functional effects of the present invention.

A polycrystalline silicon film is composed of an aggregation of grain crystals, called grain, and a grain boundary exists between the grains. This grain boundary is a boundary between grains that are largely different in crystal orientation (a large angular misorientation), and therefore the polycrystalline silicon film has a large crystal defect where the crystal lattice is disconnected. In contrast, inside the grain, the density of the crystal defect is low because the film is formed at a very high temperature when the crystallization is performed with a laser, for example. Therefore, in the polycrystalline silicon film, the crystal defects are concentrated in the grain boundary. Therefore, in order to eliminate the above-mentioned crystal defects in the polycrystalline silicon film, dangling bonds in the grain boundary with a large misorientation angle (misalignment angle with respect to the corresponding lattice) is terminated, and thereby the density of the crystal defects is reduced. These crystal defects are in a deep level and cause reduction in mobility, generally. The grain boundary can be observed to have a linear shape when exposed by etching.

In contrast, the single crystal semiconductor layer has no grain boundary because the orientation is uniform. That is, in the present invention, the characteristics are improved by deactivation of the electrically active residual hydrogen and termination of the fine defects generated by the lattice distortion caused by the hydrogen implantation (coexistence of a shallow level and a deep level). Therefore, the concentration of diffused hydrogen may be lower than that in the polycrystal film, and very wide process window (degree of freedom in process) can be obtained.

In addition, a common single crystal semiconductor layer formed by a method other than transferring is hardly influenced by the residual hydrogen and has a low defect density, originally. Therefore, if a technology of diffusing hydrogen into the silicon film is applied to such a layer, adverse effects such as change of characteristics and reduction in reliability, attributed to the diffused hydrogen, are generated.

Preferred embodiments of the production method of the semiconductor device of the present invention are mentioned below in more detail. In the present invention, it is preferable that the step of forming the single crystal semiconductor layer is performed after a part of the semiconductor device is formed on the single crystal semiconductor substrate. In this case, it is preferable that the production method of the semiconductor device is performed on the single crystal semiconductor substrate at least until a step of forming a gate electrode in the semiconductor device. It is known that if the single crystal semiconductor layer is directly formed on the insulating substrate such as a glass substrate, the single crystal semiconductor layer is separated and damaged due to difference in thermal expansion rate between the insulating substrate and the single crystal semiconductor layer. According to the method of transferring a part of the semiconductor device previously formed on the single crystal semiconductor substrate, onto an insulating substrate, a semiconductor device including a single crystal semiconductor layer can be formed on an insulating substrate such as a glass substrate.

In the present invention, it is preferable that the hydrogen-containing layer contains $1 \times 10^{22}$ to $4 \times 10^{22}$ atoms/cm$^3$ of hydrogen at the time of formation. Thus, hydrogen enough to deactivate the electrically active residual hydrogen and terminate the dangling bonds in the fine crystal defects generated by the lattice distortion caused by the hydrogen implantation can be supplied from the hydrogen-containing layer to the single crystal semiconductor layer, and thereby the characteristics of the semiconductor device can be improved. Improvement in characteristics of the semiconductor device may be insufficient if the hydrogen concentration is less than $1\times10^{22}$ atoms/cm$^3$. Problems such as film separation may be generated after thermal treatment if the hydrogen concentration is more than $4\times10^{22}$ atoms/cm$^3$. It is preferable that the concentration of the hydrogen contained in the hydrogen-containing layer at the time of formation is $2\times10^{22}$ to $3\times10^{22}$ atoms/cm$^3$.

It is preferable that the hydrogen-containing layer is a silicon nitride film. The silicon nitride film is a preferable material for constituting the semiconductor device, and is a material into which hydrogen can be sufficiently implanted and from which hydrogen can be sufficiently released. It is preferable that the silicon nitride film is formed by plasma enhanced CVD (chemical vapor deposition) method. The silicon nitride film formed by the plasma enhanced CVD (chemical vapor deposition) method contains hydrogen and therefore can be preferably used for eliminating the crystal defects in the single crystal semiconductor layer.

It is preferable that the silicon nitride film is formed at 150 to 350° C. in the plasma enhanced chemical vapor deposition. The hydrogen content in the silicon nitride film can be increased. If the temperature is less than 150° C., a dense silicon nitride film can not be formed and the film adhesion is reduced and the reliability may be reduced. If the temperature is more than 350° C., the hydrogen content may be reduced. It is more preferable that the temperature for the film formation in the plasma enhanced CVD (chemical vapor deposition) is 200 to 270° C.

It is preferable that the hydrogen-containing layer is an interlayer insulating film in the semiconductor device. Increase in steps for forming an additional hydrogen-containing layer can be suppressed. In the present description, the interlayer insulating film is not especially limited as long as it insulates each conductive part (for example, electrode, and wiring) constituting the semiconductor device.

It is preferable that the step of diffusing hydrogen is performed by annealing at 300 to 500° C. The hydrogen may be insufficiently diffused if the temperature is less than 300° C. The hydrogen may be released outside of the semiconductor device if the temperature is more than 500° C. It is more preferable that the annealing temperature in the step of diffusing hydrogen is 350 to 450° C.

It is preferable that the semiconductor device comprises at least one silicon oxide film (oxide silicon film) between the single crystal semiconductor layer and the hydrogen-containing layer. Stress from the hydrogen-containing layer to the single crystal semiconductor layer is eased, and thereby reduction in mobility in the single crystal semiconductor layer can be prevented. In addition, the silicon oxide film forms an excellent interface with the single crystal semiconductor layer. Therefore, excellent interface characteristics can be obtained, and improvement in characteristics and reliability, and stabilization can be permitted, if the silicon oxide film is formed between the single crystal semiconductor layer and the hydrogen-containing layer.

It is preferable that the single crystal semiconductor substrate is made of single crystal silicon. In this case, a single crystal silicon-containing semiconductor element having performances higher than those of a polycrystalline silicon-containing semiconductor element can be formed on the insulating substrate.

It is preferable that the insulating substrate is a glass substrate. The method of the present invention is particularly effective for the case where a glass substrate with heat resistance lower than that of a silicon substrate and the like is used as the insulating substrate, because in a commonly used method, it is difficult to form a single crystal semiconductor layer with excellent characteristics by transferring.

It is preferable that the substance for separation is a hydrogen ion or a mixture of a hydrogen ion and an ion of an inert gas element. Thereby, the separation layer can be sufficiently separated. As a result, the single crystal semiconductor layer can be formed on the insulating substrate, and therefore a single crystal silicon layer-including semiconductor device with high performances can be produced.

It is preferable that the single crystal semiconductor layer contains $1\times10^{19}$ to $1\times10^{21}$ atoms/cm$^3$ of hydrogen after the step of diffusing hydrogen. As a result, the hydrogen diffused from the hydrogen-containing layer can deactivate the electrically active residual hydrogen in the single crystal semiconductor layer and terminate the dangling bonds in the fine crystal defects generated by the lattice distortion caused by the hydrogen implantation. As a result, the mobility of the transistor can be increased and the subthreshold coefficient and leak current at OFF state can be reduced, for example, and therefore a semiconductor device with high performances can be produced. If the hydrogen concentration is less than $1\times10^{19}$ atoms/cm$^3$, the characteristics of the semiconductor device may be insufficiently improved. If the hydrogen concentration is more than $1\times10^{21}$ atoms/cm$^3$, excess hydrogen diffused from the hydrogen-containing layer becomes a donor or an acceptor to deteriorate the characteristics of the semiconductor device, or such hydrogen excessively diffuses into a gate insulating film and becomes a trap to cause reduction in reliability. It is more preferable that the concentration of the hydrogen contained in the single crystal semiconductor layer after the step of diffusing hydrogen is $5\times10^{19}$ to $5\times10^{21}$ atoms/cm$^3$.

It is preferable that the step of forming the hydrogen-containing layer is performed after the step of forming the single crystal semiconductor layer. This can prevent the hydrogen from diffusing from the hydrogen-containing layer by the annealing performed when the single crystal semiconductor layer is formed.

It is preferable that the semiconductor device comprises a first semiconductor element including the single crystal semiconductor layer formed by transferring a part of the single crystal semiconductor substrate onto the insulating substrate and a second semiconductor element including a semiconductor layer directly formed on the insulating substrate, and the first semiconductor element and the second semiconductor element are electrically connected to each other. In the present invention, the performances of the first semiconductor element can be improved by the hydrogenation of the single crystal semiconductor layer formed by the transferring, and in addition to this first semiconductor element, the second semiconductor element including a semiconductor layer directly formed on the insulating substrate can be formed. Therefore, semiconductor elements depending on desired performances can be formed. For example, the first semiconductor element including the single crystal semiconductor layer is used for a semiconductor element for which high performances are needed, and for others, the second semiconductor element including a polycrystal semiconductor layer is used. As a result, a highly integrated semiconductor elements-including semiconductor device having desired functions can be produced. In such a case, the steps of forming the single crystal semiconductor layer-including first semiconductor element, performed after the single crystal semiconductor layer is formed on the insulating substrate, can be performed in the same manner as in a common production step of a low temperature polycrystal semiconductor element directly formed on an insulating substrate. Therefore, a low temperature polycrystal semiconductor element can be simultaneously formed on the same insulating substrate in the steps of forming the first semiconductor element, performed after the single crystal semiconductor layer is formed on the insulating substrate. Thus, increase in production steps is suppressed and simultaneously the semiconductor device including the single crystal semiconductor layer and the polycrystal semiconductor layer can be produced.

It is preferable that that at least one of the first semiconductor element and the second semiconductor element is a thin film transistor. The semiconductor device produced according to the present invention can be used as an active matrix driving display device such as a liquid crystal display panel and an organic EL panel.

It is preferable that the semiconductor layer in the second semiconductor element is a polycrystalline silicon layer. The semiconductor element including the polycrystalline silicon layer can be preferably used in a full-monolithic (system-on-glass) liquid crystal display device and the like, with the first semiconductor element including the single crystal semiconductor layer. It is preferable that the polycrystalline silicon layer in the second semiconductor element is formed by annealing an amorphous silicon layer with a laser or by introducing a catalyst element into an amorphous silicon layer and annealing the amorphous silicon layer. Thus, polycrystalline silicon with high quality can be formed as the semiconductor layer in the second semiconductor element. Examples of the above-mentioned catalyst element include Ni, Co, Fe, Pd, Pt, Cu, Au, and Al, and Ni is particularly preferably used. Spin coating, sputtering, vapor deposition, dip, and the like may be mentioned as a method of introducing the catalyst element.

It is preferable that the step of diffusing hydrogen is performed simultaneously with a step of hydrogenating the semiconductor layer in the second semiconductor element. Increase in steps for forming an additional hydrogen-containing layer can be suppressed.

It is preferable that the hydrogen-containing layer is an interlayer insulating film or a passivation film (surface protective film) in the second semiconductor element. The interlayer insulating film or the passivation film in the second semiconductor element can be simultaneously formed in the steps of forming the first semiconductor element. Therefore, increase in steps for forming an additional interlayer insulating film or passivation film can be suppressed when the second semiconductor element is formed. In the present description, the passivation film is not especially limited as long as it protects the surface of the layer constituting the semiconductor device. Examples of the material forming the passivation film include a silicon nitride film, SiNO, and SiON.

The present invention is also a semiconductor device produced by the production method (hereinafter, also referred to as a first semiconductor device). According to such a first semiconductor device of the present invention, functions of the semiconductor element with characteristics deteriorated by the hydrogen implantation are recovered. Therefore, a single crystal semiconductor layer-including semiconductor element with characteristics equal to those of a semiconductor element including a single crystal semiconductor layer formed not by transferring can be formed on an insulating substrate.

The present invention is also a semiconductor device (hereinafter, also referred to as a second semiconductor device) comprising a single crystal semiconductor layer formed on an insulating substrate, wherein the semiconductor device comprises a hydrogen-containing layer on at least one side of the single crystal semiconductor layer; the single crystal semiconductor layer is formed by transferring a part of the single crystal semiconductor substrate, separated at a separation layer formed by implanting a substance for separation into the single crystal semiconductor substrate, onto the insulating substrate; and the single crystal semiconductor layer contains hydrogen diffused from the hydrogen-containing layer. According to such a second semiconductor device of the present invention, hydrogen is diffused from the hydrogen-containing layer to the single crystal semiconductor layer, and thereby electrically active hydrogen which is contained in the substance for separation and remains even after the separation at the separation layer is deteriorated and the dangling bond in the lattice defect caused by the implantation of the substance for separation are terminated. As a result, characteristics of the semiconductor device including the single crystal semiconductor layer formed by the transferring on the insulating substrate can be improved.

It is preferable that the single crystal semiconductor layer contains $1 \times 10^{19}$ atoms/cm$^3$ or more of hydrogen. The term "or more" in the present description means that the described value is included. The hydrogen is diffused from the hydrogen-containing layer, and thereby the single crystal semiconductor layer can contain $1 \times 10^{19}$ atoms/cm$^3$ or more of hydrogen. As a result, the hydrogen diffused from the hydrogen-containing layer deactivates the electrically active residual hydrogen in the single crystal semiconductor layer and also terminates the dangling bond in fine crystal defect generated by the lattice distortion caused by the hydrogen implantation. As a result, a mobility can be increased and a subthreshold coefficient and a leak current at OFF state can be reduced, for example, and therefore a semiconductor device with high performances can be provided. If the hydrogen concentration is less than $1 \times 10^{19}$ atoms/cm$^3$, the characteristics of the semiconductor device may be insufficiently improved. The low limit of the concentration of the hydrogen contained in the single crystal semiconductor layer is preferably $5 \times 10^{19}$ atoms/cm$^3$, and the upper limit thereof is preferably $1 \times 10^{21}$ atoms/cm$^3$, and more preferably $5 \times 10^{21}$ atoms/cm$^3$. If the concentration is more than $1 \times 10^{21}$ atoms/cm$^3$, excess hydrogen diffused from the hydrogen-containing layer becomes a donor or an acceptor to deteriorate the characteristics of the semiconductor device, or the hydrogen excessively diffused into the gate insulating film becomes a trap to cause reduction in reliability.

The present invention is also a semiconductor device (also referred to as a third semiconductor device) a semiconductor device comprising a single crystal semiconductor layer formed on an insulating substrate, wherein the semiconductor device comprises a hydrogen-containing layer on at least one side of the single crystal semiconductor layer; the single crystal semiconductor layer is formed by transferring a part of the single crystal semiconductor substrate, separated at a separation layer formed by implanting a substance for separation into the single crystal semiconductor substrate, onto the insulating substrate; and the single crystal semiconductor layer contains $1 \times 10^{19}$ atoms/cm$^3$ or more of hydrogen. According to such a third semiconductor device of the present invention, the electrically active hydrogen which is contained in the substance for separation and remains in the single crystal semiconductor layer even after the separation at the separation layer is deactivated and the dangling bond in the lattice defect caused by the implantation of the substance for separation can be terminated, because $1 \times 10^{19}$ atoms/cm$^3$ or more of hydrogen is contained. As a result, a mobility can be increased and a subthreshold coefficient and a leak current at OFF state can be reduced, for example, and therefore characteristics of a semiconductor device including a single crystal semiconductor layer formed by the transferring on the insulating substrate can be improved. If the hydrogen concentration is less than $1 \times 10^{19}$ atoms/cm$^3$, the characteristics of the semiconductor device may be insufficiently improved. The low limit of the concentration of the hydrogen contained in the single crystal semiconductor layer is preferably $5 \times 10^{19}$ atoms/cm$^3$, and the upper limit thereof is preferably $1 \times 10^{21}$ atoms/cm$^3$, and more preferably $5 \times 10^{21}$ atoms/cm$^3$. If the concentration is more than 1×10$^{21}$ atoms/cm$^3$, excess hydrogen diffused from the hydrogen-containing layer becomes a donor or an acceptor to deteriorate the characteristics of the semiconductor device, or the hydrogen excessively diffused into the gate insulating film becomes a trap to cause reduction in reliability.

In the above-mentioned second or third semiconductor devices, existence of crystal damage caused by the implantation of the substance for separation into the single crystal semiconductor layer and existence of the substance for separation itself prove that the single crystal semiconductor layer is formed by transferring a part of the single crystal semiconductor substrate, separated at the separation layer formed by implanting the substance for separation into the single crystal semiconductor substrate, onto the insulating substrate. A hydrogen ion, a mixture of a hydrogen ion and an ion of an inert gas, and the like is preferably used as the substance for separation. Existence of the inert gas element can be observed in the single crystal semiconductor layer if the mixture of a hydrogen ion and an ion of an inert gas is used. That is, examples of the preferable embodiment of the above-mentioned single crystal semiconductor layer include an embodiment in which the single crystal semiconductor layer contains an inert gas element.

The preferable embodiments of the above-mentioned second or third semiconductor device are the same as those in the first semiconductor device. The preferable embodiments of the above-mentioned second or third semiconductor device are mentioned below, but the details are omitted because they are the same as in the explanation on the production method of the semiconductor device of the present invention.

In the above-mentioned second or third semiconductor device, it is preferable that the hydrogen-containing layer is a silicon nitride film. In this case, it is preferable that the silicon nitride film is formed by plasma enhanced chemical vapor deposition method. It is also preferable that the hydrogen-containing layer is an interlayer insulating film in the semiconductor device. Further, it is preferable in the above-mentioned second or third semiconductor device that the second or third semiconductor device comprises at least one silicon oxide film between the single crystal semiconductor layer and the hydrogen-containing layer. It is preferable that the single crystal semiconductor substrate is made of single crystal silicon. It is preferable that the insulating substrate is a glass substrate. It is preferable that the second or third semiconductor device comprises a first semiconductor element including the single crystal semiconductor layer and a second semiconductor element including a semiconductor layer directly formed on the insulating substrate, and the first semiconductor element and the second semiconductor element are electrically connected to each other. In this case, it is preferable that that at least one of the first semiconductor element and the second semiconductor element is a thin film transistor. Further, it is preferable that the semiconductor layer in the second semiconductor element is a polycrystalline silicon layer. It is also preferable that the hydrogen-containing layer is an interlayer insulating film or a passivation film in the second semiconductor element.

The present invention is also a liquid crystal display device comprising the semiconductor device. According to such a liquid crystal display device of the present invention, the liquid crystal display device can be thinned and downsized and reliability of the device can be improved if a digital driver, a DC-DC converter, a DAC (Digital to Analog Converter), a RF (radio-frequency radiation) circuit, and the like, which are peripheral circuits, are integrally formed on a glass substrate, that is, the liquid crystal display device has a so-called fully monolithic structure.

EFFECT OF THE INVENTION

According to the production method of the semiconductor device of the present invention, hydrogen is diffused from the hydrogen-containing layer into the single crystal semiconductor layer formed by transferring a part of the single crystal semiconductor substrate onto the insulating substrate, and thereby the electrically active residual hydrogen is deactivated and the dangling bond in the fine crystal defect generated by the lattice distortion caused by the hydrogen implantation are terminated. Therefore, the characteristics of the semiconductor element including the single crystal semiconductor layer formed by the transferring on the insulating substrate can be improved.

BEST MODES FOR CARRYING OUT THE INVENTION

The present invention is mentioned in more detail below with reference to Embodiments, using drawings, but the present invention is not limited to only these Embodiments.

Embodiment 1

FIGS. 1-1 to 1-9 are cross-sectional views showing a production method of one NMOS (Negative Metal Oxide Semiconductor) transistor in Embodiment 1. In the present Embodiment, one NMOS transistor is mentioned, but a PMOS (Positive Metal Oxide Semiconductor) transistor can be formed by appropriately changing an impurity conductivity type at the time of ion implantation. In the semiconductor device in the present Embodiment, a plurality of NMOS transistors and/or PMOS transistors is formed on the same semiconductor substrate.

First, a thermal oxide film 2 is formed on a silicon substrate 1 by a thermal oxidation method, and by ion implantation, a P-type impurity element 3 such as boron is implanted into the silicon substrate 1, as shown in FIG. 1-1. Annealing is performed at 1000 to 1200° C. for 30 to 180 minutes (for example, at 1100° C. for 90 minutes), and thereby a P-well region 4 where the ion-implanted P-type impurity element 3 is diffused and activated, as shown in FIG. 1-2. A substance for separation 5 such as H$^+$, H$^{2+}$, He$^+$, and Ne$^+$ is implanted by ion implantation into the silicon substrate 1 (for example, 2×10$^{16}$ ions/cm$^2$ of H$^+$ and 1×10$^{16}$ ions/cm$^2$ of He$^+$ are implanted), and thereby a separation layer 6 is formed, as shown in FIG. 1-3.

The surface of the thermal oxide film 2 is washed by an aqueous solution including 5% hydrogen peroxide and 2% ammonia (SC1) and then, the thermal oxide film 2 is attached to a glass substrate 7, as shown in FIGS. 1-4. Then, annealing is performed at 400 to 600° C. for 1 minute to 5 hours (for example, at 600° C. for 2 minutes). As a result, as shown in FIG. 1-5, separation from the silicon substrate 1 is performed at the separation layer 6, and thereby a single crystal silicon layer 8 is formed on a glass substrate 7.

The separation layer 6 is removed by etching and the like, and then the single crystal silicon layer 8 is thinned to have a film thickness of about 50 nm, as shown in FIGS. 1-6. The single crystal silicon layer 8 is patterned to form an active region, and then a gate insulating film (silicon oxide film) 9 is formed by plasma enhanced CVD (chemical vapor deposition) method and the like, as shown in FIG. 1-7. A gate electrode 10 in an NMOS transistor is formed, and then an N-type impurity element 11 such as phosphorus is implanted by ion implantation using the gate electrode 10 as a mask, thereby an N-type low concentration impurity region 12a and a channel region 12b are formed inside the single crystal silicon layer 8. Further, annealing is performed at about 600° C. for 60 minutes, thereby activating the impurities.

Then, a silicon oxide film 13 serving as an interlayer insulating film and a silicon nitride film (hydrogen-containing layer) 14 are successively formed by plasma enhanced CVD (chemical vapor deposition) method, as shown in FIG. 1-9. Annealing is performed at 300 to 500° C. for 30 to 120 minutes (for example, at 400° C. for 60 minutes), and thereby hydrogen 15 is diffused into the single crystal silicon layer 8. This hydrogen 15 deactivates electrically active residual hydrogen in the single crystal silicon layer 8 and also terminates a dangling bond in a fine crystal defect generated by lattice distortion caused by the hydrogen implantation. Finally, a contact hole and an electrode 16 are formed, and an NMOS transistor is completed. A semiconductor device including the NMOS transistor formed in the present. Embodiment has excellent characteristics because reduction in mobility, shift of a threshold voltage, increase in leak current at OFF state, and increase in subthreshold coefficient and the like, caused by hydrogen implantation performed in the separation layer formation, are improved.

In the present Embodiment, a second NMOS transistor 31 is formed simultaneously with the first NMOS transistor 32 on the same glass substrate 7 in the steps of forming the first NMOS transistor 32, performed after the single crystal silicon layer 8 is formed on the glass substrate 7. This is because the steps of forming the first NMOS transistor 32 including the single crystal silicon layer 8, performed after the single crystal silicon layer 8 is formed on the glass substrate 7, are the same as common production steps of the second NMOS transistor 31 including a low temperature polycrystalline silicon layer 33 directly formed on the glass substrate 7. As a result, increase in production steps is suppressed, and simultaneously a semiconductor device including the single crystal silicon layer 8 and the polycrystalline silicon layer 33 can be produced, as shown in FIG. 2. Further, a semiconductor device including highly integrated transistors with desired functions can be produced by using the first NMOS transistor 32 including the single crystal silicon layer for an NMOS transistor for which high performances are needed and using the second NMOS transistor 31 including the polycrystalline silicon layer for others.

Embodiment 2

FIGS. 3-1 to 3-16 are cross-sectional views schematically showing a production method of one NMOS transistor in Embodiment 2. In the present Embodiment, one NMOS transistor is mentioned, but a PMOS transistor can be formed by appropriately changing an impurity conductivity type at the time of ion implantation. In the semiconductor device in the present Embodiment, a plurality of NMOS transistors and/or PMOS transistors is formed on the same semiconductor substrate. The NMOS and the PMOS are appropriately separated by LOCOS (Local Oxidation Of Silicon), trench isolation, and the like.

First, a thermal oxide film 2 is formed on a silicon substrate 1 by a thermal oxidation method, and by ion implantation, a P-type impurity element 3 such as boron is implanted into the silicon substrate 1, as shown in FIG. 3-1. Annealing is performed at 1000 to 1200° C. for 60 to 180 minutes (for example, at 1100° C. for 120 minutes), and thereby a P-well region 4 where the ion-implanted P-type impurity element 2 is diffused and activated, as shown in FIG. 3-2.

A silicon nitride film 24 is formed and then patterned, as shown in FIG. 3-3. LOCOS oxidation is performed to form a LOCOS oxide film 25, as shown in FIG. 3-4.

The silicon nitride film 24 and the thermal oxide film 2 are once removed, and then a gate insulating film 9 is formed, as shown in FIG. 3-5. A gate electrode 10 in an NMOS transistor is formed, as shown in FIG. 3-6. An N-type impurity element 11 such as phosphorus is implanted by ion implantation using the gate electrode 10 as a mask, and thereby an N-type low concentration impurity region 12a is formed. A silicon oxide film is formed by CVD (chemical vapor deposition) method and the like and anisotropically dry-etched. As a result, as shown in FIG. 3-8, a sidewall 26 made of oxide silicon is formed on both sides of the gate electrode 10.

An N-type impurity element 11 such as phosphorus is implanted using the gate electrode 10 and the sidewall 26 as a mask, and thereby an N-type high concentration impurity region 27 is formed, as shown in FIG. 3-9. An insulating film 20a made of oxide silicon and the like is formed, and then the ion-implanted N-type impurity element 11 is activated by annealing at 900° C. for 10 minutes, as shown in FIG. 3-10. Then, an insulating film 20b made of oxide silicon is formed and then the surface thereof is planarized by CMP (Chemical Mechanical Polishing) and the like.

Then, a substance for separation 5 such as $H^+$, $H^{2+}$, $He^+$, and $Ne^+$ is implanted into the silicon substrate 1 by ion implantation (for example, $6\times10^{16}$ ions/cm$^2$ of $H^+$ is implanted), and thereby a separation layer 6 is formed, as shown in FIG. 3-11. An insulating film 20c made of oxide silicon and the like is formed, as shown in FIG. 3-12. Then, a contact hole and an electrode 19 are formed, as shown in FIG. 3-13.

An insulating film 20d is formed, and then the surface thereof is planarized by CMP and the like and further washed as shown in FIG. 3-14. Then, the insulating film 20d is attached to a glass substrate 7, and annealing is performed at 400 to 600° C. for 1 minute to 5 hours (for example, at 600° C. for 2 minutes). As a result, as shown in FIG. 3-15, separation from the silicon substrate 1 is performed at the separation layer 6, and thereby an NMOS transistor is formed on the glass substrate 7.

The separation layer 6 is removed by etching and the like, and the p-well region 4 is thinned by etching and the like in order to thin the channel layer in the NMOS transistor and expose the LOCOS oxide film 25 for separation between the elements. As a result, as shown in FIG. 3-16, the channel region 12b is formed.

Then, in order to form an excellent interface on which a silicon nitride film is formed, a silicon oxide film 22 is formed on a single crystal silicon layer 8 consisting of the N-type low concentration impurity region 12a, the channel region 12b, and the N-type high concentration impurity region 27. Further, annealing is performed at 675° C. for 10 minutes in order to reduce an interface level between the transferred single crystal silicon-layer 8 and the silicon oxide film 22 and to recover crystal defects of the transferred single crystal silicon layer 8.

Then, a hydrogen-containing layer (silicon nitride film) 14 is formed by plasma enhanced CVD (chemical vapor deposition) method.

Such film formation is performed at 200° C. in order to increase the amount of hydrogen contained in the silicon nitride film 14. Then, annealing is performed at 350° C. for 1 hour and thereby hydrogen is diffused into the active region in the single crystal silicon layer 8. This hydrogen deactivates electrically active residual hydrogen in the single crystal silicon layer 8 and also terminates a dangling bond in a fine crystal defect generated by lattice distortion caused by the hydrogen implantation. Thus, an NMOS transistor is completed. A semiconductor device including the NMOS transistor formed in the present Embodiment has excellent characteristics because reduction in mobility, shift of a threshold voltage, increase in leak current at OFF state, and increase in subthreshold coefficient and the like, caused by hydrogen implantation performed in the separation layer formation, are improved.

Also in Embodiment 2, the transferred single crystal silicon TFT and the polycrystalline silicon TFT are simultaneously prepared on the same glass substrate and electrically connected to each other because the processes performed after the transferring onto the glass substrate 7 are the same as those for the polycrystalline silicon TFT, as in Embodiment 1.

This Nonprovisional application claims priority (under 35 U.S.C. §119) on Patent Application No. 2005-128135 filed in Japan on Apr. 26, 2005, the entire contents of which are hereby incorporated by reference.

BRIEF DESCRIPTION OF DRAWINGS

FIG. 1-2 is a cross-sectional view schematically showing production flow of the NMOS transistor in Embodiment 1 (formation of the P-well region).

FIG. 1-3 is a cross-sectional view schematically showing production flow of the NMOS transistor in Embodiment 1 (formation of the separation layer).

FIG. 1-4 is a cross-sectional view schematically showing production flow of the NMOS transistor in Embodiment 1 (attachment of the thermal oxide film to the glass substrate).

FIG. 1-5 is a cross-sectional view schematically showing production flow of the NMOS transistor in Embodiment 1 (formation of the single crystal silicon layer on the glass substrate).

FIG. 1-6 is a cross-sectional view schematically showing production flow of the NMOS transistor in Embodiment 1 (thinning of the single crystal silicon layer).

FIG. 1-7 is a cross-sectional view schematically showing production flow of the NMOS transistor in Embodiment 1 (formation of the gate insulating film).

FIG. 1-8 is a cross-sectional view schematically showing production flow of the NMOS transistor in Embodiment 1 (ion implantation into the single crystal silicon layer).

FIG. 1-9 is a cross-sectional view schematically showing production flow of the NMOS transistor in Embodiment 1 (hydrogen diffusion).

FIG. 2 is a cross-sectional view schematically showing a semiconductor device including the single crystal semiconductor layer-including transistor in Embodiment 1 and a low temperature polycrystal semiconductor layer-including transistor, formed on the same glass substrate.

FIG. 3-1 is a cross-sectional view schematically showing production flow of the NMOS transistor in Embodiment 2 (ion implantation into the silicon substrate).

FIG. 3-2 is a cross-sectional view schematically showing production flow of the NMOS transistor in Embodiment 2 (formation of the P-well region).

FIG. 3-3 is a cross-sectional view schematically showing production flow of the NMOS transistor in Embodiment 2 (formation of the silicon nitride film).

FIG. 3-4 is a cross-sectional view schematically showing production flow of the NMOS transistor in Embodiment 2 (formation of the LOCOS oxide film).

FIG. 3-5 is a cross-sectional view schematically showing production flow of the NMOS transistor in Embodiment 2 (formation of the gate insulating film).

FIG. 3-6 is a cross-sectional view schematically showing production flow of the NMOS transistor in Embodiment 2 (formation of the gate electrode).

FIG. 3-7 is a cross-sectional view schematically showing production flow of the NMOS transistor in Embodiment 2 (ion implantation into the P-well region).

FIG. 3-8 is a cross-sectional view schematically showing production flow of the NMOS transistor in Embodiment 2 (formation of the sidewall).

FIG. 3-9 is a cross-sectional view schematically showing production flow of the NMOS transistor in Embodiment 2 (ion implantation into the N-type low concentration impurity region).

FIG. 3-10 is a cross-sectional view schematically showing production flow of the NMOS transistor in Embodiment 2 (formation of the insulating film).

FIG. 3-11 is a cross-sectional view schematically showing production flow of the NMOS transistor in Embodiment 2 (formation of the separation layer).

FIG. 3-12 is a cross-sectional view schematically showing production flow of the NMOS transistor in Embodiment 2 (formation of the insulating film).

FIG. 3-13 is a cross-sectional view schematically showing production flow of the NMOS transistor in Embodiment 2 (formation of the electrode).

FIG. 3-14 is a cross-sectional view schematically showing production flow of the NMOS transistor in Embodiment 2 (attachment of the insulating film to the glass substrate).

FIG. 3-15 is a cross-sectional view schematically showing production flow of the NMOS transistor in Embodiment 2 (separation at the separation layer).

FIG. 3-16 is a cross-sectional view schematically showing production flow of the NMOS transistor in Embodiment 2 (hydrogen diffusion).

FIG. 4 is a graph showing difference in characteristics of a source-drain current according to a gate voltage, between the case where the MOS containing the single crystal silicon layer formed by the transferring includes the hydrogen-containing layer and the case where it includes no hydrogen-containing layer.

EXPLANATION OF NUMERALS AND SYMBOLS

Figure 1:
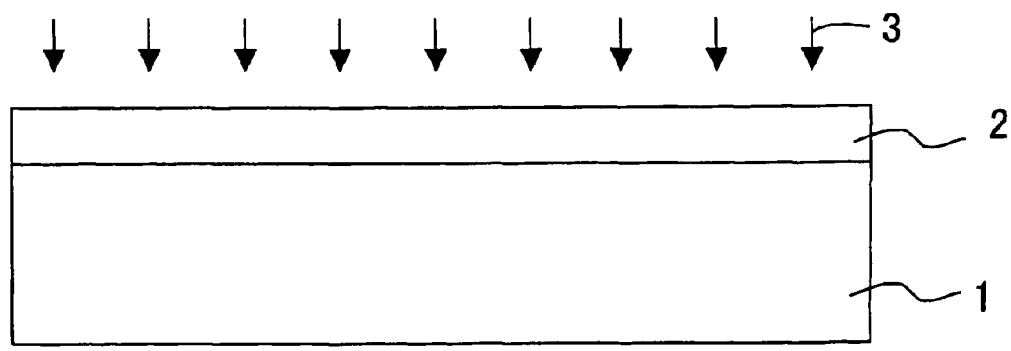
FIG. 1-1 is a cross-sectional view schematically showing production flow of the NMOS transistor in Embodiment 1 (ion implantation into the silicon substrate).
Figures 1, 2:
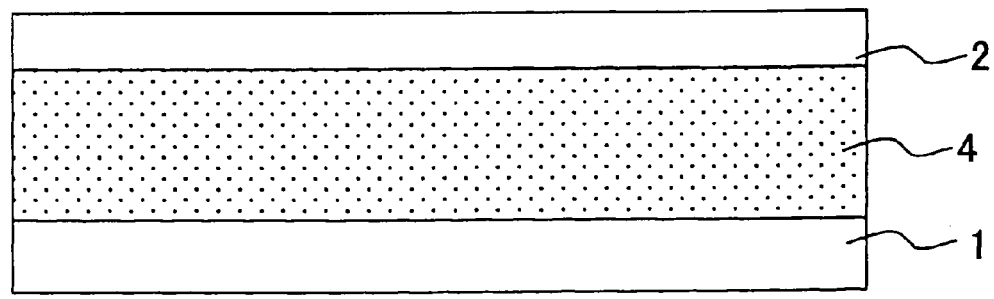
Figures 1, 2, 3:
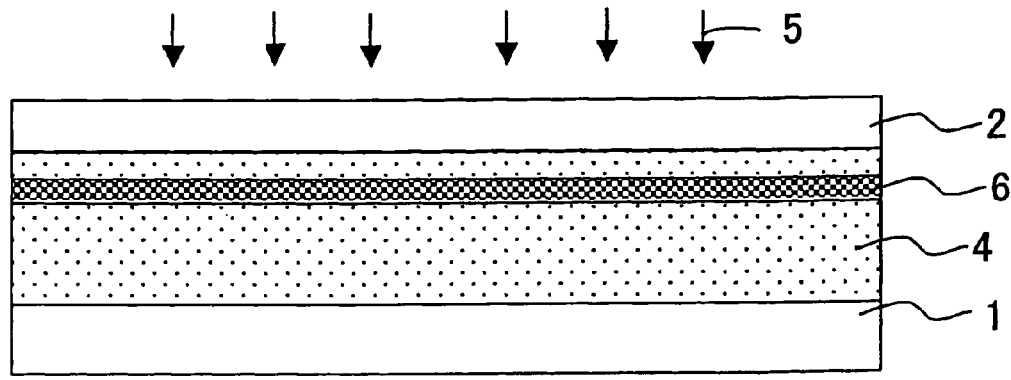
Figures 1, 2, 3, 4:
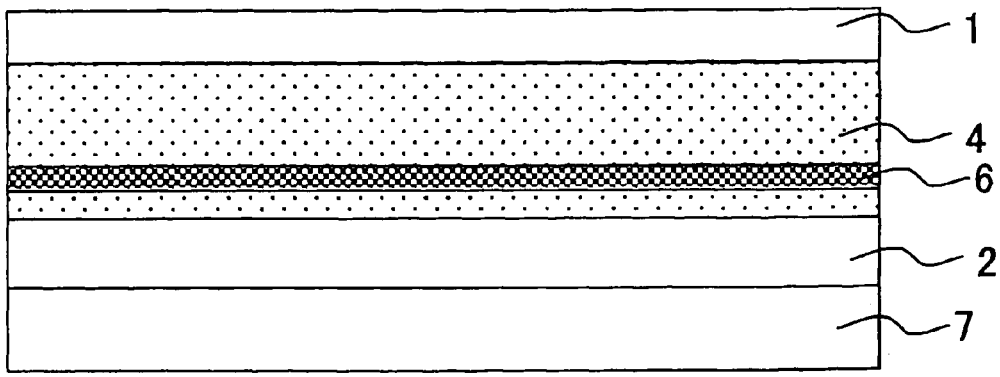
Figures 1, 2, 3, 4, 5:
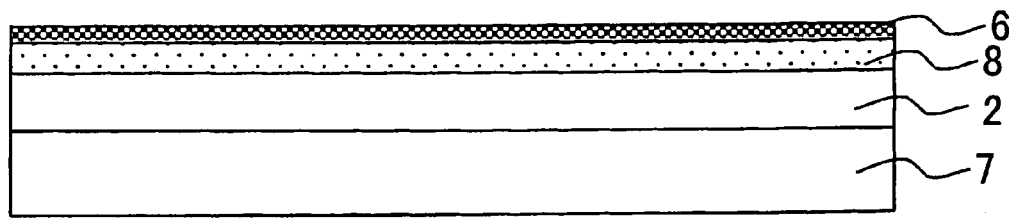
Figures 1, 2, 3, 4, 5, 6:
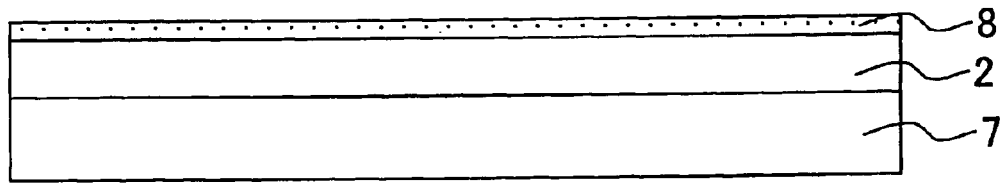
Figures 1, 2, 3, 4, 5, 6, 7:
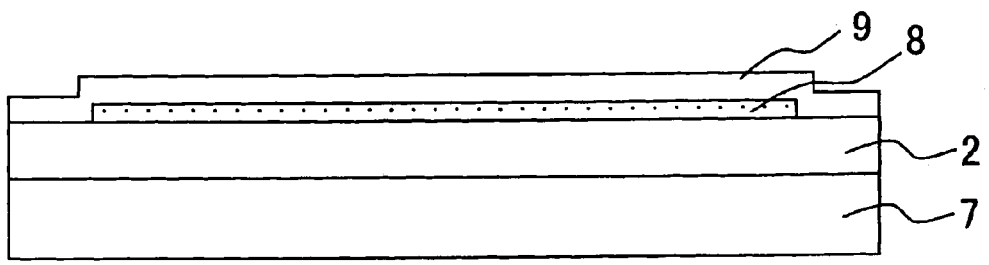
Figures 1, 2, 3, 4, 5, 6, 7, 8:
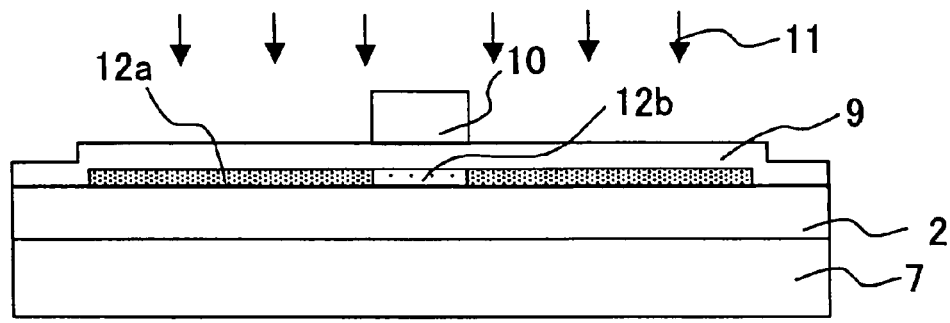
Figures 1, 2, 3, 4, 5, 6, 7, 8, 9:
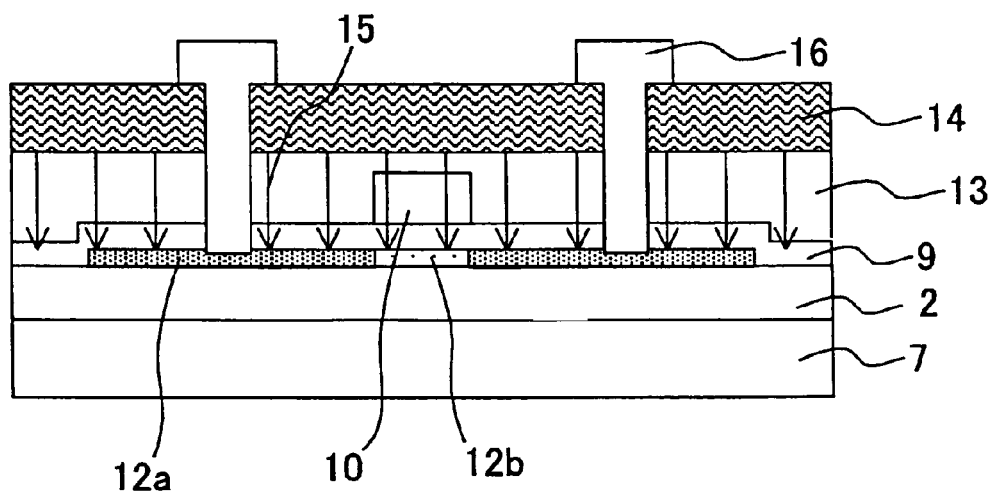
Figure 2:
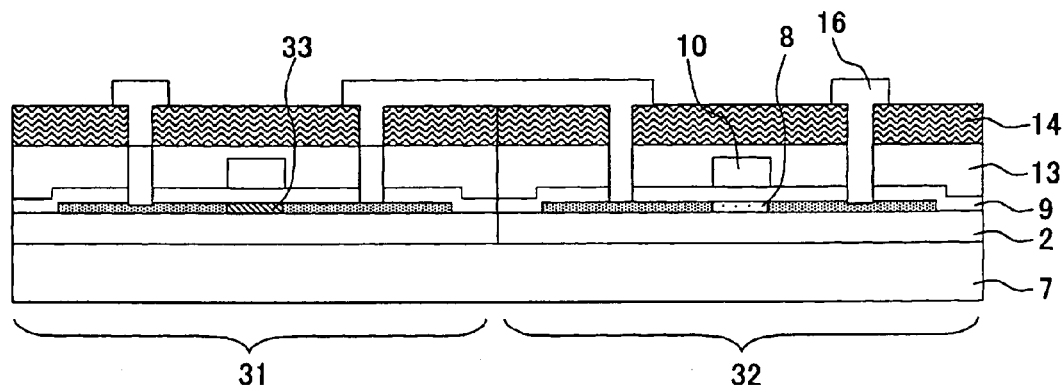
Figures 1, 3:
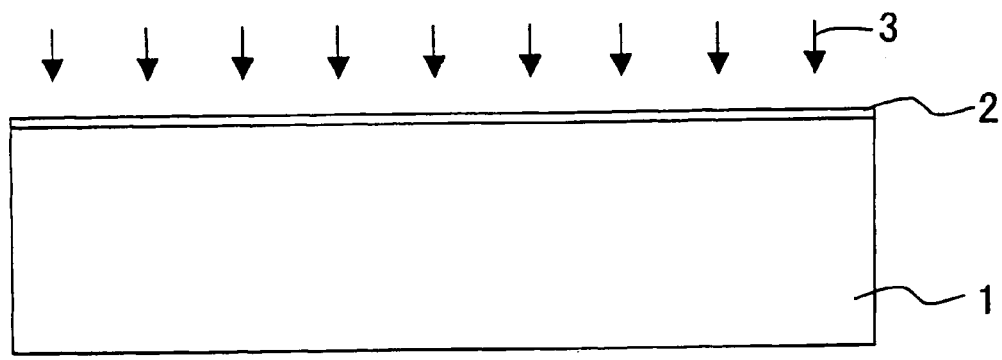
Figures 2, 3:
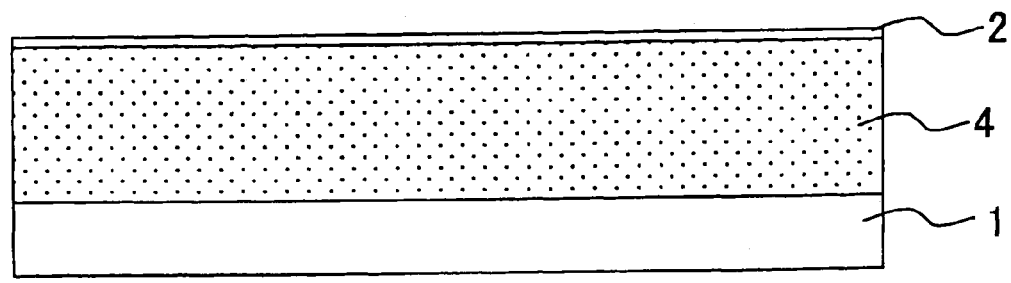
Figure 3:
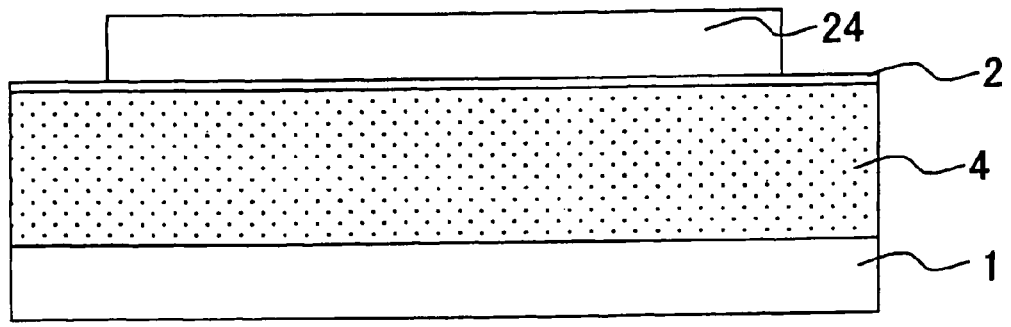
Figures 3, 4:
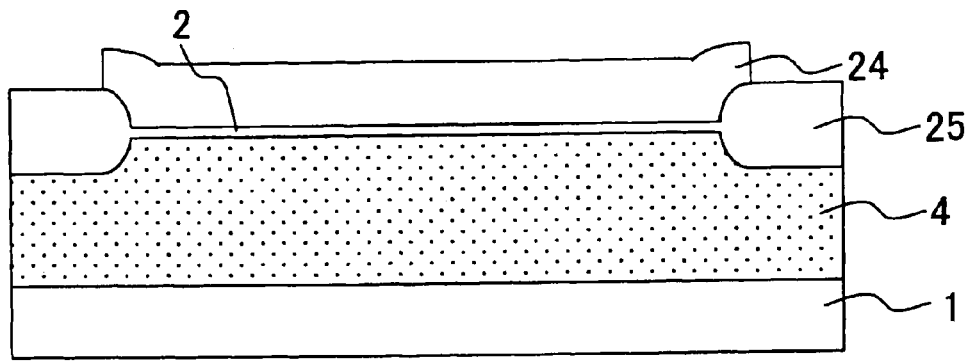
Figures 3, 4, 5:
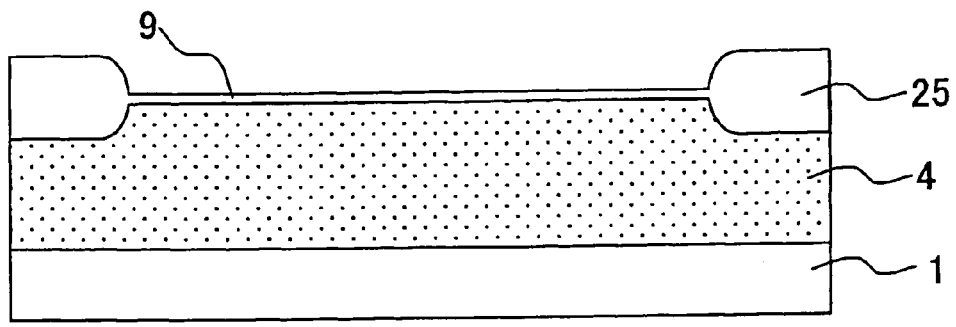
Figures 3, 4, 5, 6:
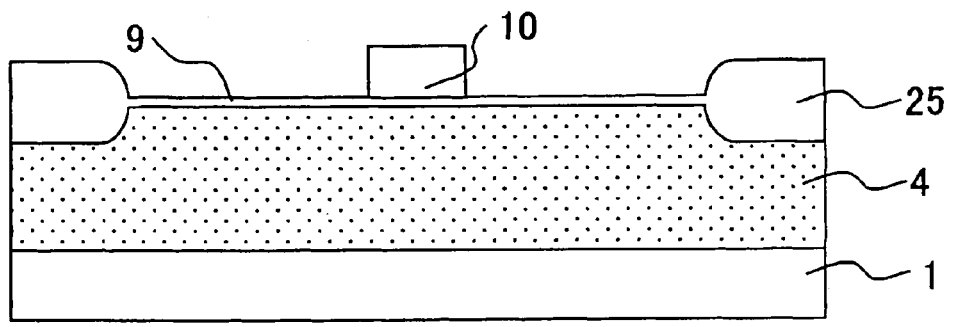
Figures 3, 4, 5, 6, 7:
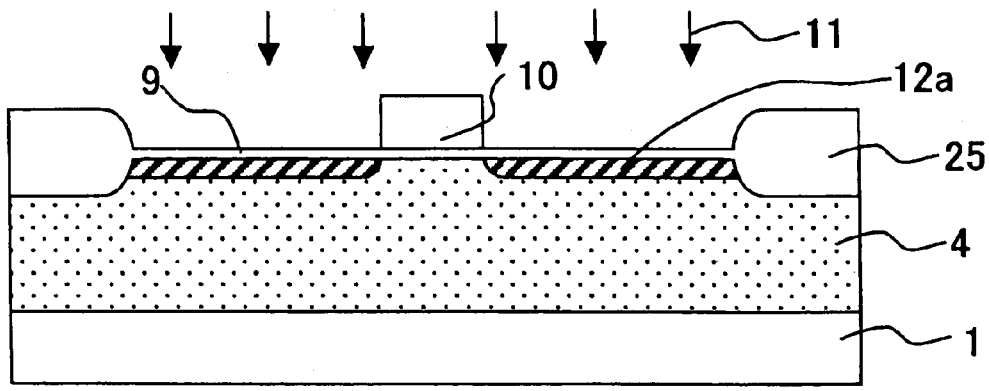
Figures 3, 4, 5, 6, 7, 8:
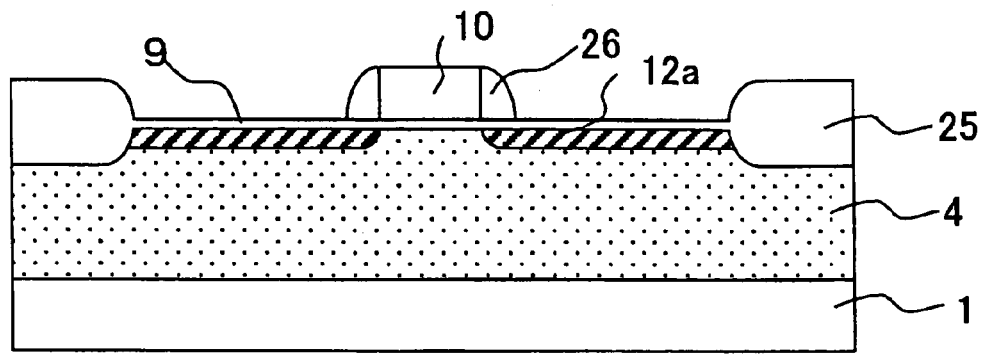
Figures 3, 4, 5, 6, 7, 8, 9:
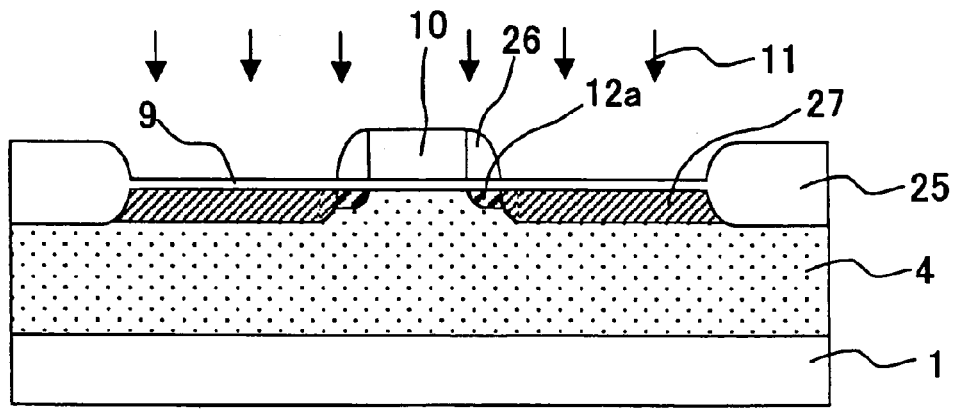
Figures 3, 4, 5, 6, 7, 8, 9, 10:
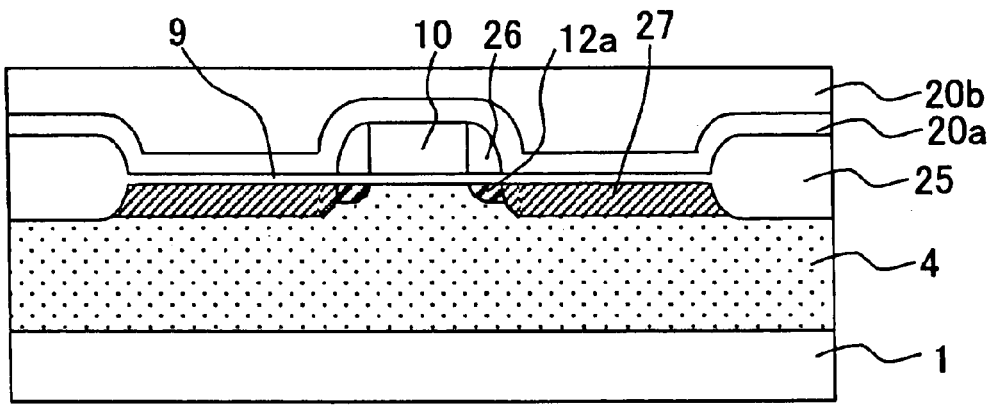
Figures 3, 4, 5, 6, 7, 8, 9, 10, 11:
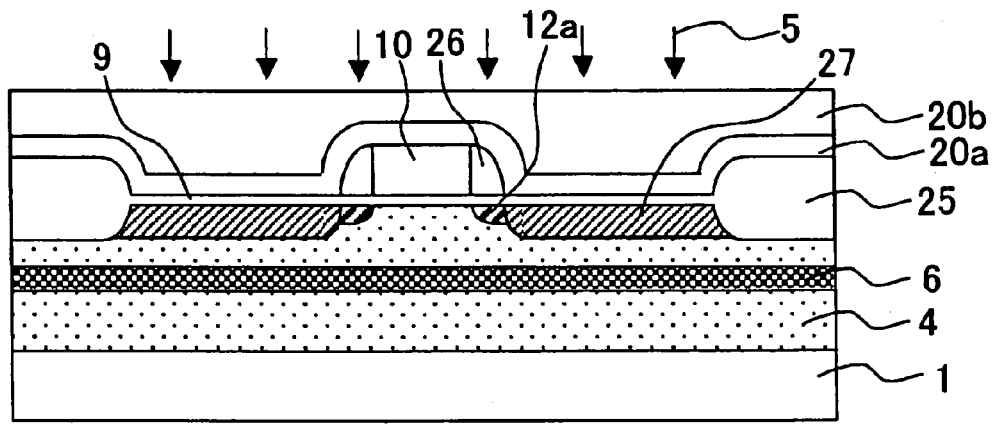
Figures 3, 4, 5, 6, 7, 8, 9, 10, 11, 12:
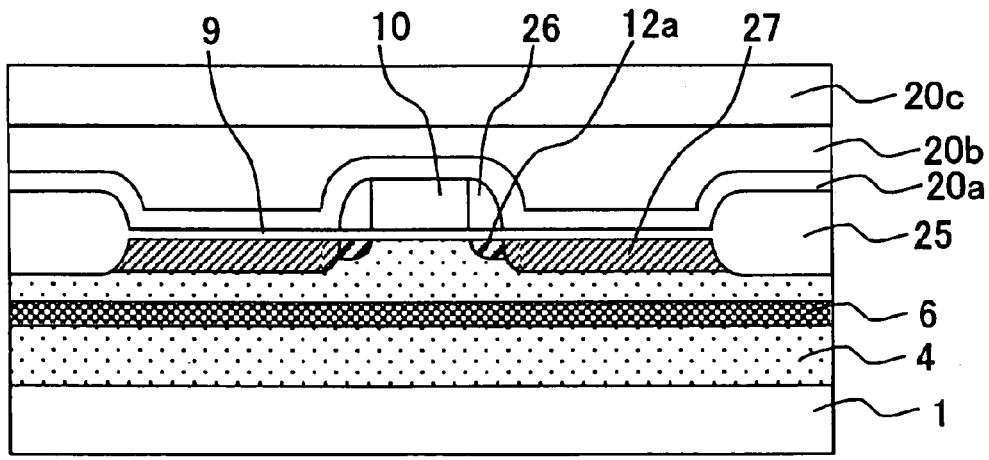
Figures 3, 4, 5, 6, 7, 8, 9, 10, 11, 12, 13:
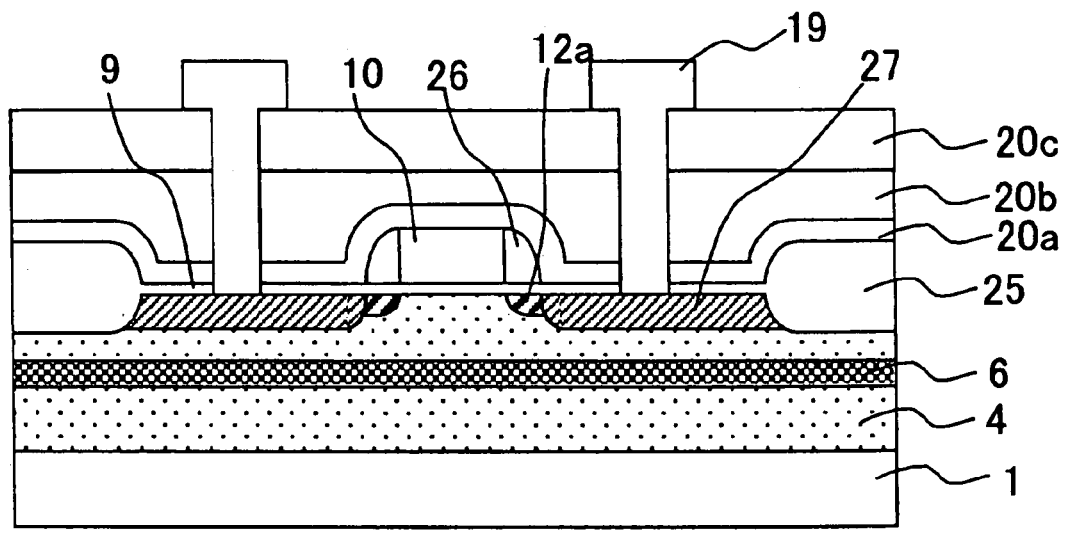
Figures 3, 4, 5, 6, 7, 8, 9, 10, 11, 12, 13, 14:
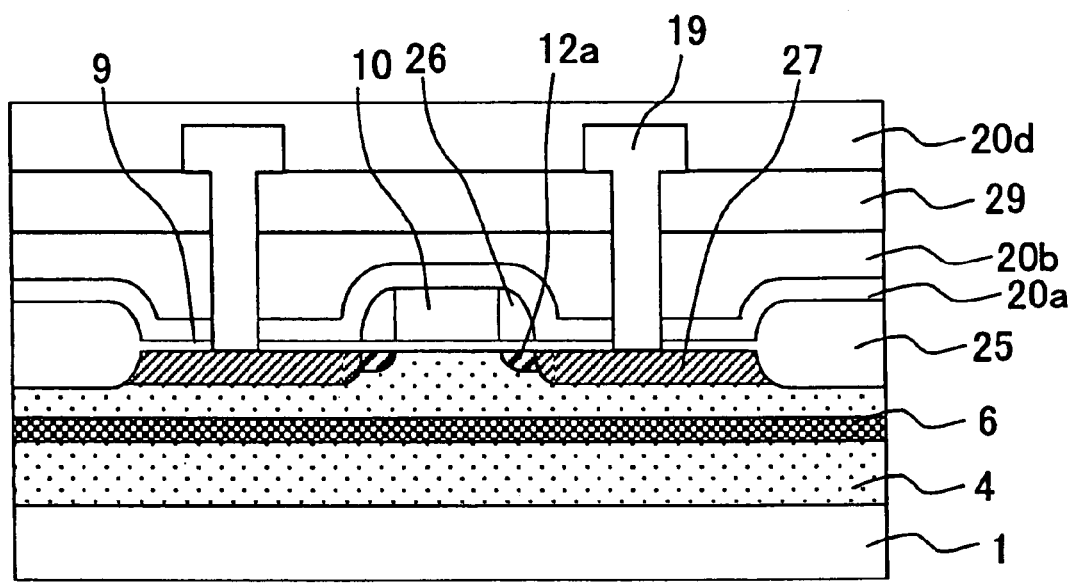
Figures 3, 4, 5, 6, 7, 8, 9, 10, 11, 12, 13, 14, 15:
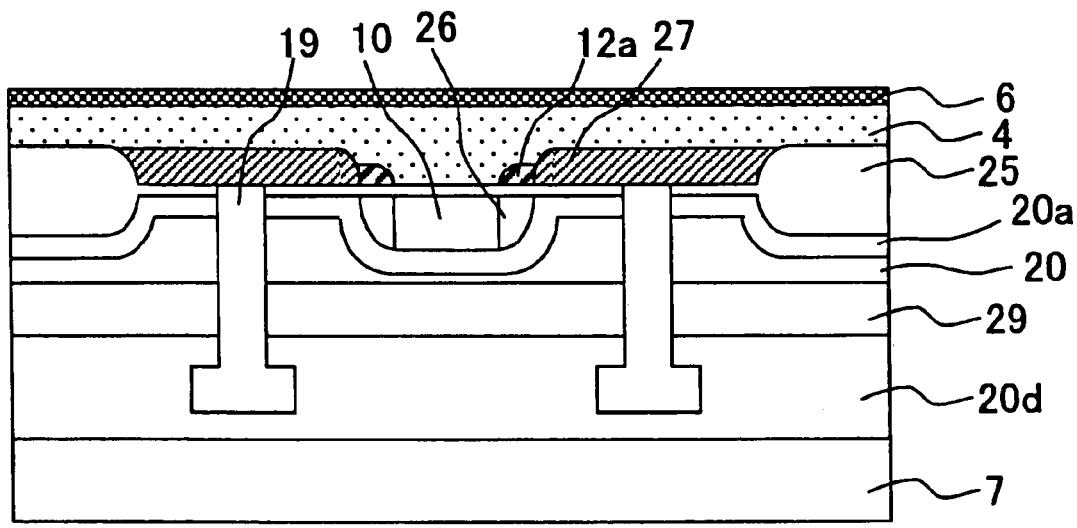
Figures 3, 4, 5, 6, 7, 8, 9, 10, 11, 12, 13, 14, 15, 16:
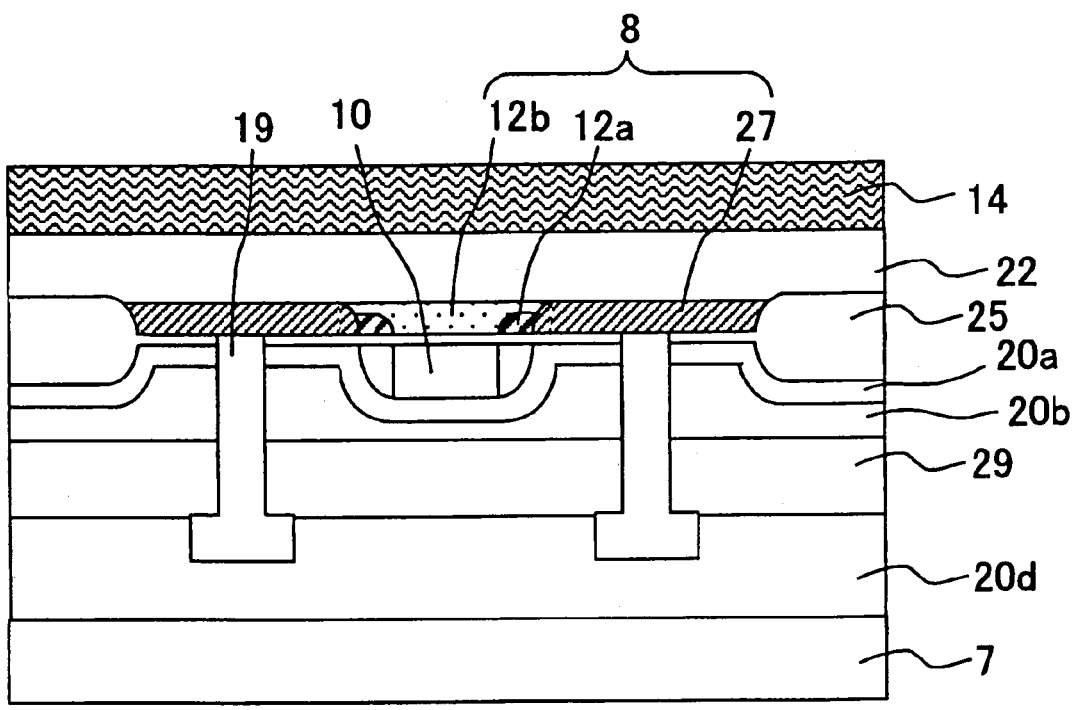
Figure 4:
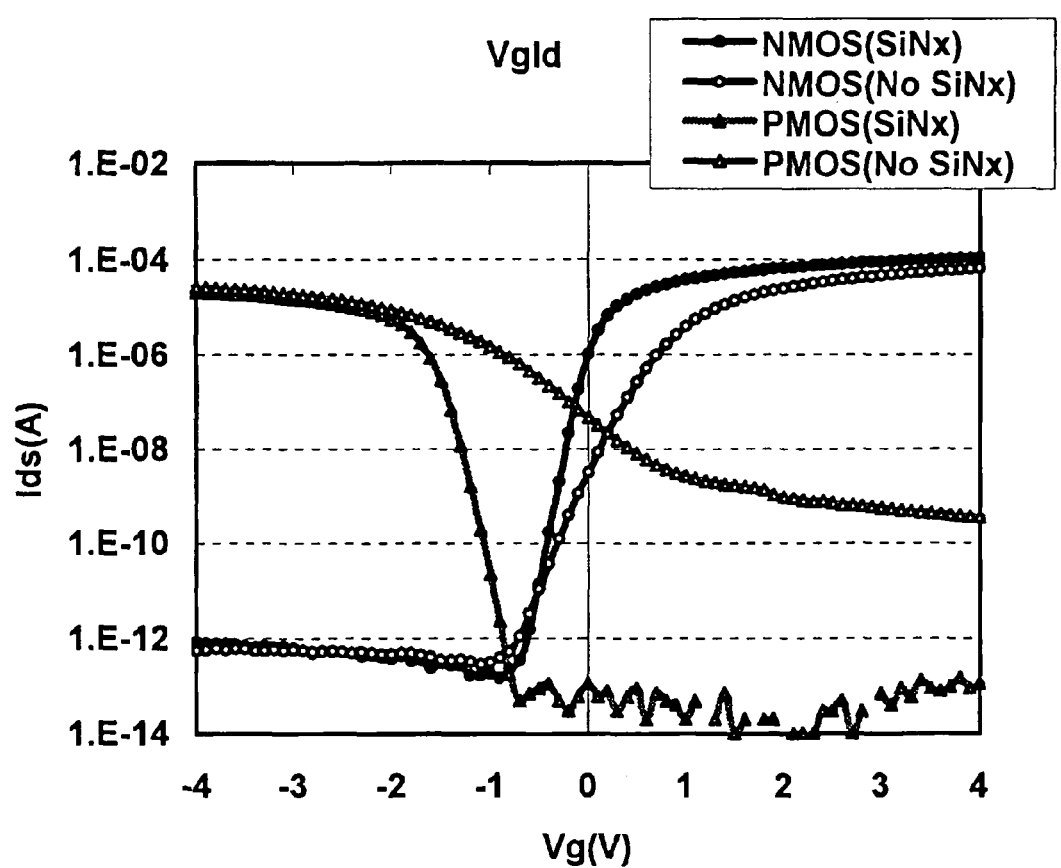

1: silicon substrate
2: thermal oxide film
3: P-type impurity element
4: P-well region
5: substance for separation
6: separation layer
7: glass substrate
8: single crystal silicon layer
9: gate insulating film (silicon oxide film)
10: gate electrode
11: N-type impurity element
12a: N-type low concentration impurity region
12b: channel region
13: silicon oxide film (interlayer insulating film)
14: silicon nitride film (hydrogen-containing layer serving as an interlayer insulating film)
15: hydrogen
16, 19: electrode
20a, 20b, 20c, 20d: insulating film
22: silicon oxide film
24: silicon nitride film (mask for LOCOS oxidation)
25: LOCOS oxide film
26: sidewall
27: N-type high concentration impurity region
31: second NMOS transistor
32: first NMOS transistor
33: polycrystalline silicon layer

The invention claimed is:

1. A production method of a semiconductor device comprising a single crystal semiconductor layer formed on an insulating substrate, the production method comprising the steps of:

implanting a substance for separation into a single crystal semiconductor substrate, thereby forming a separation layer;

transferring a part of the single crystal semiconductor substrate, separated at the separation layer, onto the insulating substrate, thereby forming the single crystal semiconductor layer;

forming a hydrogen-containing layer on at least one side of the single crystal semiconductor layer; and diffusing hydrogen from the hydrogen-containing layer to the single crystal semiconductor layer, wherein the hydrogen-containing layer contains $1 \times 10^{22}$ to $4 \times 10^{22}$ atoms/cm$^3$ of hydrogen at the time of formation.

2. The production method of the semiconductor device according to claim 1, wherein the step of forming the single crystal semiconductor layer is performed after a part of the semiconductor device is formed on the single crystal semiconductor substrate.

3. The production method of the semiconductor device according to claim 1, wherein the production method of the semiconductor device is performed on the single crystal semiconductor substrate at least until a step of forming a gate electrode in the semiconductor device.

4. The production method of the semiconductor device according to claim 1, wherein the hydrogen-containing layer is a silicon nitride film.

5. The production method of the semiconductor device according to claim 4, wherein the silicon nitride film is formed by plasma enhanced chemical vapor deposition method.

6. The production method of the semiconductor device according to claim 5, wherein the silicon nitride film is formed at 150 to 350° C. in the plasma enhanced chemical vapor deposition.

7. The production method of the semiconductor device according to claim 1, wherein the hydrogen-containing layer is an interlayer insulating film in the semiconductor device.

8. The production method of the semiconductor device according to claim 1, wherein the step of diffusing hydrogen is performed by annealing at 300 to 500° C.

9. The production method of the semiconductor device according to claim 1, wherein the semiconductor device comprises at least one silicon oxide film between the single crystal semiconductor layer and the hydrogen-containing layer.

10. The production method of the semiconductor device according to claim 1, wherein the single crystal semiconductor substrate is made of single crystal silicon.

11. The production method of the semiconductor device according to claim 1, wherein the insulating substrate is a glass substrate.

12. The production method of the semiconductor device according to claim 1, wherein the substance for separation is a hydrogen ion or a mixture of a hydrogen ion and an ion of an inert gas element.

13. The production method of the semiconductor device according to claim 1, wherein the single crystal semiconductor layer contains $1 \times 10^{19}$ to $1 \times 10^{21}$ atoms/cm$^3$ of hydrogen after the step of diffusing hydrogen.

14. The production method of the semiconductor device according to claim 1, wherein the step of forming the hydrogen-containing layer is performed after the step of forming the single crystal semiconductor layer.

15. The production method of the semiconductor device according to claim 1, wherein the semiconductor device comprises a first semiconductor element including the single crystal semiconductor layer formed by transferring a part of the single crystal semiconductor substrate onto the insulating substrate and a second semiconductor element including a semiconductor layer directly formed on the insulating substrate, and the first semiconductor element and the second semiconductor element are electrically connected to each other.

16. The semiconductor device according to claim 15, wherein at least one of the first semiconductor element and the second semiconductor element is a thin film transistor.

17. The production method of the semiconductor device according to claim 15, wherein the semiconductor layer in the second semiconductor element is a polycrystalline silicon layer.

18. The production method of the semiconductor device according to claim 17, wherein the polycrystalline silicon layer in the second semiconductor element is formed by annealing an amorphous silicon layer with a laser.

19. The production method of the semiconductor device according to claim 17, wherein the polycrystalline silicon layer in the second semiconductor element is formed by introducing a catalyst element into an amorphous silicon layer and annealing the amorphous silicon layer.

20. The production method of the semiconductor device according to claim 15, wherein the step of diffusing hydrogen is performed simultaneously with a step of hydrogenating the semiconductor layer in the second semiconductor element.

21. The production method of the semiconductor device according to claim 15, wherein the hydrogen-containing layer is an interlayer insulating film or a passivation film in the second semiconductor element.

22. A semiconductor device produced by the production method of the semiconductor device of claim 1.

23. A liquid crystal display device comprising the the semiconductor device of claim 22.

* * * * *